(12) United States Patent
Sun et al.

(10) Patent No.: US 12,086,443 B2
(45) Date of Patent: Sep. 10, 2024

(54) SUPPLEMENTAL AI PROCESSING IN MEMORY

(71) Applicant: Micron Technology, Inc., Boise, ID (US)

(72) Inventors: Honglin Sun, Boise, ID (US); Richard C. Murphy, Boise, ID (US); Glen E. Hush, Boise, ID (US)

(*) Notice: Subject to any disclaimer, the term of this patent is extended or adjusted under 35 U.S.C. 154(b) by 0 days.

(21) Appl. No.: 18/079,141

(22) Filed: Dec. 12, 2022

(65) Prior Publication Data

US 2023/0111878 A1    Apr. 13, 2023

Related U.S. Application Data (63) Continuation of application No. 17/365,712, filed on Jul. 1, 2021, now Pat. No. 11,526,289, which is a continuation of application No. 16/545,304, filed on Aug. 20, 2019, now Pat. No. 11,055,003.

(51) Int. Cl.
| | |
|---|---|
| *G06F 12/00* | (2006.01) |
| *G06F 3/06* | (2006.01) |
| *G06F 9/38* | (2018.01) |
| *G06F 13/16* | (2006.01) |
| *G06N 3/082* | (2023.01) |

(52) U.S. Cl.
CPC ............ *G06F 3/064* (2013.01); *G06F 3/0659* (2013.01); *G06F 3/0688* (2013.01); *G06F 9/3877* (2013.01); *G06F 13/1678* (2013.01); *G06N 3/082* (2013.01); *G06F 3/0607* (2013.01)

(58) Field of Classification Search
CPC ...... G06F 3/064; G06F 3/0659; G06F 3/0688; G06F 3/0607; G06F 9/3877; G06F 13/1678; G06N 3/082; G06N 3/02; G06N 3/08
See application file for complete search history.

(56) References Cited

U.S. PATENT DOCUMENTS

| | | |
|---|---|---|
| 5,050,095 A | 9/1991 | Samad |
| 5,388,841 A | 2/1995 | San et al. |
| 5,875,347 A | 2/1999 | Watanabe et al. |
| 7,043,466 B2 | 5/2006 | Watanabe et al. |
| 8,611,284 B2 | 12/2013 | Agrawal et al. |
| 2004/0073764 A1 | 4/2004 | Andreasson |
| 2005/0050259 A1* | 3/2005 | Niggemeier ......... G11C 7/1042 711/157 |
| 2013/0138925 A1* | 5/2013 | Hickey ............... G06F 9/30025 712/214 |

(Continued)

FOREIGN PATENT DOCUMENTS

WO    2019025864 A2    2/2019

OTHER PUBLICATIONS

International Search Report and Written Opinion from related International PCT Application Serial No. PCT/US2020/046965, dated Nov. 25, 2020, 10 pages.

(Continued)

*Primary Examiner* — Shawn X Gu (57) ABSTRACT

Apparatuses and methods can be related to supplementing AI processing in memory. An accelerator and/or a host can perform AI processing. Some of the operations comprising the AI processing can be performed by a memory device instead of by an accelerator and/or a host. The memory device can perform AI processing in conjunction with the host and/or accelerator.

20 Claims, 5 Drawing Sheets

(56) References Cited

U.S. PATENT DOCUMENTS

| | | |
|---|---|---|
| 2014/0136754 A1 | 5/2014 | Hyde et al. |
| 2015/0155876 A1 | 6/2015 | Jayasena et al. |
| 2015/0357008 A1 | 12/2015 | Manning et al. |
| 2017/0365304 A1 | 12/2017 | Zawodny et al. |
| 2018/0107406 A1 | 4/2018 | O et al. |
| 2018/0189635 A1 | 7/2018 | Olarig et al. |
| 2018/0364944 A1 | 12/2018 | Grossman et al. |
| 2019/0198082 A1 | 6/2019 | O |
| 2020/0050476 A1* | 2/2020 | Xu .................. G06F 9/5027 |
| 2020/0057932 A1* | 2/2020 | Gao .................. G10L 25/30 |
| 2020/0184320 A1 | 6/2020 | Croxford et al. |

OTHER PUBLICATIONS

Finkbeiner, "In-memory Intelligence", Architectures for the Post Moore Era, IEEE Micro, vol. 37(4), dated Aug. 21, 2017, 8 pages.

\* cited by examiner

SUPPLEMENTAL AI PROCESSING IN MEMORY

PRIORITY INFORMATION

This application is a Continuation of U.S. application Ser. No. 17/365,712 filed on Jul. 1, 2021, which is a Continuation of U.S. application Ser. No. 16/545,304, filed on Aug. 20, 2019, now U.S. Pat. No. 11,055,003 issued on Jul. 6, 2021, the contents of which are incorporated herein by reference.

TECHNICAL FIELD

The present disclosure relates generally to memory, and more particularly to apparatuses and methods associated with supplementing artificial intelligence (AI) processing in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

Various computing systems include a number of processing resources that are coupled to memory (e.g., a memory system), which is accessed in association with executing a set of instructions (e.g., a program, applications, etc.). The processing resources can execute instructions to perform artificial intelligence (AI). The processing resources may be dedicated to perform AI. AI can include learning and/or problem solving. For instance, AI can be characterized by the ability to problem solve and to learn such that the rate of success of problem solving increases over time and/or over the examples identified. AI can also include the ability to perceive an environment corresponding to a problem being solved. For instance, AI can be used to identify features of an image where the image is the environment and the successes and failures of identification are used to improve the success rate of feature identification.

DETAILED DESCRIPTION

The present disclosure includes apparatuses and methods related to supplementing artificial intelligence (AI) processing in memory. AI can include machine learning. Machine learning can include performing a task without using explicit instructions while relying on patterns and/or inference derived from a data set instead. As used herein, references to AI can also include references to machine learning. Machine learning may include training a neural network or inferencing using a trained neural network, or both.

Processing resources can be configured to perform operations consistent with AI. For instance, processing resources can execute instructions for email filtering, computer vision, data mining, and/or natural language, among other areas in which AI can be implemented. The processing resources can be of general use such as a processing resource that is part of a host. In various instances, the processing resources can be dedicated to AI. For example, processing resources can include AI chips which may also be referred to as AI accelerators and/or AI processing resources. The AI chips can also be referred to accelerators.

AI chips may be processing resources for AI applications including neural networks (e.g., artificial neural networks), machine vision, and/or machine learning. AI chips may be used in mobile devices, internet of things (IOT) devices, and other devices that perform data intensive or sensor driven tasks.

In some instances, AI chips may perform operations which may be offloaded to a different processing resource. Offloading tasks to different processing resource may increase the efficiency of an AI chip and/or may decrease the complexity of an AI chip. In examples where the processing resources are co-located in a memory device with data used by the AI chip, the efficiency of the AI chip may increase due to the latency corresponding to moving data from the memory device to a processing resource.

Offloading tasks from processing resources used in AI applications may be referred to as supplementing AI processing in memory. In some examples, assisting an AI chip can also be considered supplementing AI processing. For instance, a memory device may supplement AI processing by preparing data for use by an AI chip and/or by preparing data generated by an AI chip for storage in the memory device. A memory device can also supplement AI processing by processing data generated by an AI chip and designated for delivery to the AI chip and/or a different processing resource such as a host.

In some examples, AI processing can be supplemented by performing operations that may be performed by the AI chip other than preparing data. For instance, a memory device may perform machine learning utilizing a neural network implemented by the memory device. The data used by the neural network may be generated by an AI chip, and the result of the neural network may be utilized by the AI chip for AI processing. As used herein, AI processing can include the execution of operations utilized for AI. Machine learning operations can include the operations utilized for machine learning.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1:
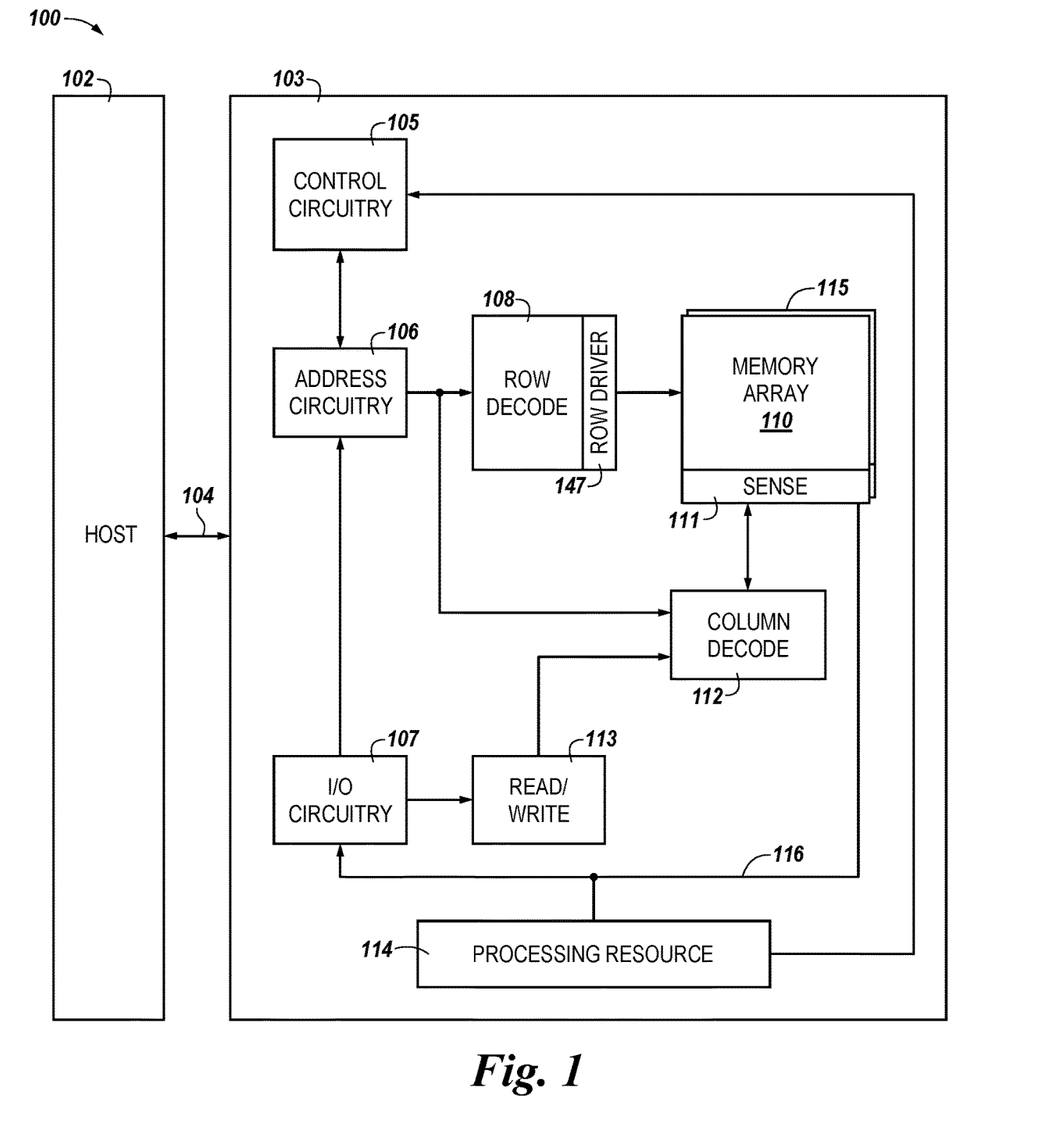
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 120. The system 100 can include separate integrated circuits, or both the host 102 and the memory device 103 can be on the same integrated circuit. For example, the host 102 may be a system controller of a memory system comprising multiple memory devices 103, with the system controller 102 providing access to the respective memory devices 103 by another processing resource such as a central processing unit (CPU). The host 102 can also be an AI chip configured for AI processing.

In the example shown in FIG. 1, the host 102 is responsible for executing an operating system (OS) and/or various applications (e.g., AI processes) that can be loaded thereto (e.g., from memory device 103 via control circuitry 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although a single array 110 is shown in FIG. 1, embodiments are not so limited. For instance, memory device 103 may include a number of arrays 110 (e.g., a number of banks of DRAM cells).

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Compute Express Link (CXL), Gen-Z, CCIX, or the like. Address signals are received and decoded by a row decoder 108 and a column decoder 112 to access the memory array 110. Data can be read from memory array 110 by sensing voltage and/or current changes on the sense lines using sensing circuitry 111. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device.

The example of FIG. 1 shows the processing resources 114 and 115. The processing resource 114 can be coupled to the control circuitry 105 and the data lines 116. The processing resources 114 and 115 can perform operations on data read from the memory array 110 prior to providing the data through the interface 104. Although both the processing resources 114 and 115 are shown in FIG. 1, memory device 103 may be implemented with one or more of the processing resources 114 and/or 115. For example, in at least one embodiment, the memory device 103 can include the processing resources 115 configured as complementary metal-oxide-semiconductor (CMOS) under the memory array 110, but not include the processing resources 114. As another example, in at least one embodiment, the memory device 103 can include the processing resources 114 configured as a separate chip on the memory device 103, but not include the processing resources 115.

In various examples, the processing resource 114 can access data from the data lines 116, process the data, and provide the data through the data lines 116. For instance, the data lines 116 can be coupled to latches which are used to latch the data provided through the data lines 116. The data can be read from the latches coupled to the data lines 116 to retrieve the data for processing. Responsive to processing the data, the processing resource 114 can update the latches to store the updated data. The charges corresponding to the updated data can be moved from the latches back to the data lines 116.

Each of the latches can, for example, include a plurality of AND gates and a plurality of NOR gates. A first AND gate and the second AND gate can receive a signal indicating whether the processing resource 114 is to access the data. The first AND gate can receive a signal from the processing resource 114 comprising the updated data. The second AND gate can also receive a signal from the processing resource 114 comprising the inverse of the updated data.

The first NOR gate can receive the output from the first AND gate and the output of second NOR gate. The first NOR gate can be coupled to the data lines such the data lines and the output from the second NOR gate merge to provide the input of the first NOR gate. The processing resource 114 can also be coupled to the second NOR gate such that the output of the second NOR gate is provided to the processing resource 114, allowing for the reading of the values stored in the latch. The output of the first NOR gate can be provided as an input to the second NOR gate. The second NOR gate can also receive the output of the second AND gate as an input.

In various examples, the processing resource 114 can access data from the sense amplifiers. The processing resources 114 can perform AI processing on the data to generate the processed data. The processing resources 114 also activate the data lines with the processed data.

The processing resource 115 can also be utilized to perform AI processing. The processing resource 115 (e.g., CMOS under array) can include a number of logic blocks that are configured to perform various functions, for example, using data values stored in the memory array 110. The processing resource 115 can further be coupled to the sense amplifiers 111 and/or the data lines such that the processing resource 115 can provide data to the sense amplifiers 111 and/or the data lines 116.

The processing resources 114 and/or 115 can be configured to perform AI processing on the data stored in the memory array 110. The processing resources 114 and/or 115 can be configured to process streams of data. For instance, the processing resources 114 and/or 115 can be configured to process data having a size equal to the width of a data bus (e.g., interface 104). The processing resources 114 and/or 115 can also process data having a size greater than a width of the data bus and provide the data through the interface 104 in chunks having a size equal to the width of the data bus. Stream processing can also include performing operations on data read from the memory array 110 prior to providing the data through the data bus (e.g., interface 104).

The processing resources 114 and/or 115 can process the data prior to storing the data in the memory array 110 and/or after reading the data from the memory array 110. For instance, the processing resource 114 can process the data read from the memory array 110 while the processing resource 115 processes data prior to or responsive to storing the data in the memory array 110. The processing resources 114 and/or 115 can perform AI processing to prepare data for processing by the AI chip and/or to prepare data to be received by a processing resource other than the AI chip such as the host 102.

Figure 2:
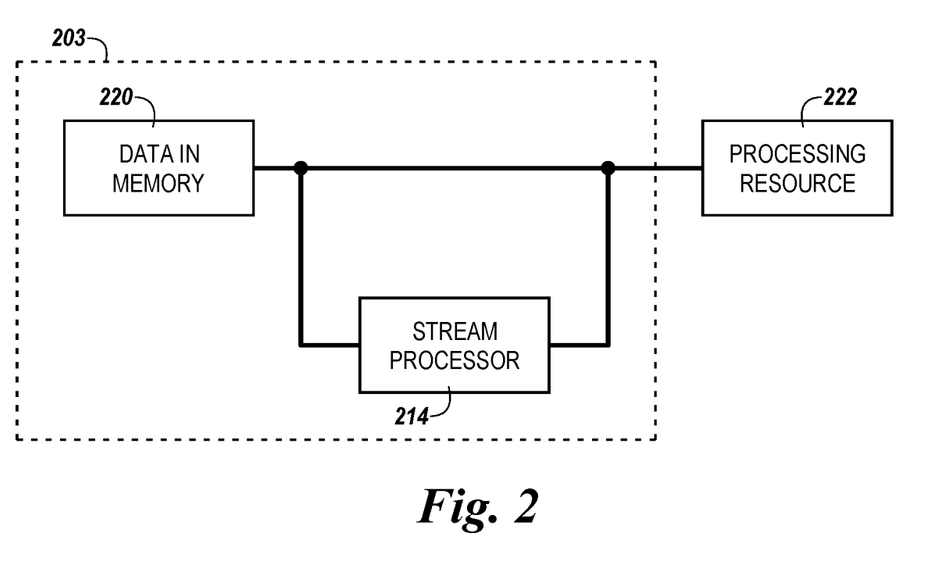
FIG. 2 is a block diagram of an apparatus in the form of a computing system including a memory device and a processing resource in accordance with a number of embodiments of the present disclosure.

FIG. 2 is a block diagram of an apparatus in the form of a computing system including a memory device 203 and a processing resource 222 in accordance with a number of embodiments of the present disclosure. Memory device 203 shows the stream processor 214. The memory device 203 is analogous to the memory device 103 and the stream processor 214 is analogous to the processing resources 114 and/or 115 in FIG. 1.

The processing resource 222 can be an AI chip, for example. The processing resource 222 can also be a host, a graphical processing unit (GPU), and/or a different processing resource. In the examples described herein, the processing resource 222 is described as an AI chip. The processing resource 222 can perform AI processing. To process data 220 stored at the memory device 203 at the processing resource 222, the processing resource 222 may retrieve the data 220 from the memory device 203. The data stored in a memory array of the memory device 203 may be described as raw data given that the data has not been prepared for processing by the processing resource 222. The raw data 220 may be retrieved from the memory array and provided to a stream processor 214. The stream processor 214 can perform a plurality of operations characteristic of AI processing prior to providing the data to the processing resource 222.

The stream processor 214 provides stream processing when interacting with the processing resource 222. "Stream" describes the interaction of the stream processor 214 and the processing resource 222. Stream processing includes processing of the data 220 in the data path between the memory and the processing resource 222. The stream processing can begin at the stream processor 214 can be concluded at the processing resource 222. The stream processing can begin at the processing resource 222 can be concluded at the stream processor 214. Stream processing can be carried out at the processing resource 222 and the stream processor 214 simultaneously. For instance, the stream processor 214 can process data to generate a first data set. The stream processor 214 can provide the first data set to the processing resource 222. Upon receiving a first data set at the processing resource 222, the processing resource 222 can generate a second data set while the stream processor 214 is generating a third data set. Similarly, the processing resource 222 may provide a first data set to the stream processor 214. Upon receipt of the first data set at the stream processor 214, the stream processor 214 can generate a second data set while the processing resource 222 is generating a third data set.

In some examples, the processing resource 222 can perform AI processing to identify a feature of an image, a context of a word, and/or classification of a data set, among other applications of machine learning performed on a first data set. The identified feature of an image, the context of a word, and/or the classification of the data set can be provided as a second data set to the stream processor 214. The second data set may be in a first format that is native to the processing resource 222 but may not be native to different processing resources such as a host and/or a GPU. The stream processor 214 may translate the data in the first format to a second format prior to saving the data to the memory array of the memory device 203. Translating the data to the second format prior to saving the data to the memory array can make the data available to the different processing resources in a format that is compatible with the different processing resources and/or applications executed by the processing resources.

The stream processor 214 can also process the data 220 prior to providing the data 220 to the processing resource 222. For instance, the stream processor 214 may receive raw data in a first format and may process the data to generate the data in a second format. The first format may not be compatible with the processing resource 222 and/or applications executed by the processing resource 222. The data 220 may be stored in a first format which may include a raw format. A raw format may include unformatted data. The AI processing performed by the stream processor may identify and/or generate rules that can be used to format the data.

The stream processor 214 can provide the identified rules in conjunction with providing the raw data to the processing resource 222. For instance, the stream processor 214 can identify weights of a network that can be used to format the data. The weights may be generated from the data and/or training data. The weights of the network and the data can be provided to the processing resource 222. The processing resource 222 may utilize the weights to configure a network hosted by the processing resource 222 and/or may utilize the weights as a starting point from which the processing resource 222 further refines the weights of a network.

In various examples, the data can describe an image. For example, the data can describe pixels of the image, among other types of image descriptions that can be represented by the data 220. The data 220 can be in a YCC format prior to being provided to the stream processor 214. The YCC format may be referred to in the art as a $YC_BC_R$ or $Y'C_BC_R$ format, where Y is luminance, Y' is luma, $C_B$ is blue-difference, and $C_R$ is red difference. YCC color spaces are defined by a mathematical coordinate transformation from an associated red green blue (RGB) color space. Data in YCC format may be more efficient than RGB format because RGB has more redundancy. The stream processor 214 can convert the data 220 to an RGB format. The processed data can then be provided to the processing resource 222 for further AI processing, which may include the identification of features of the image represented by the data.

In some instances, the data 220 can be provided to the stream processor 214. The stream processor 214 can perform AI processing on the data 220 to identify features of the image represented by the data, for example. The stream processor 214 can provide a description of the features or a description of the features and the data to the processing resources 222. The processing resource 222 can perform AI processing on the result of the stream processor 214. For example, the processing resources 222 can categorize the features identified by the stream processor 214. If the stream processor 214 identifies features of face imagery, then the processing resource 222 can identify a face based on the features identified by the stream processor 214 to perform image recognition. In various instances, the stream processor 214 can identify a face based on the features identified by the stream processing resource 222.

The stream processor can be activated by control circuitry of the memory device 203. In some examples, the stream processor can also be activated by a host. The control circuitry can determine whether to provide the raw data 220 to the processing resource 222 or processed data to the processing resource 222. The control circuitry can control a number of multiplexors to provide the raw data 220 or the processed data. In some examples, the control circuitry can determine the operations performed by the stream processor 214. For instance, the control circuitry can control the network implemented by the stream processor 214. The control circuitry can receive control commands from the processing resource 222 describing the type of AI processing that is to be performed by the stream processor 214. The control commands can be associated with access commands. For example, the processing resource 222 can request, from the control circuitry, that features be identified in the data accessed by a subsequent access command. The processing resource 222 can also request, through the control commands, that the data be translated from a first format to a second format. For example, the control commands can identify the second format.

Figure 3:
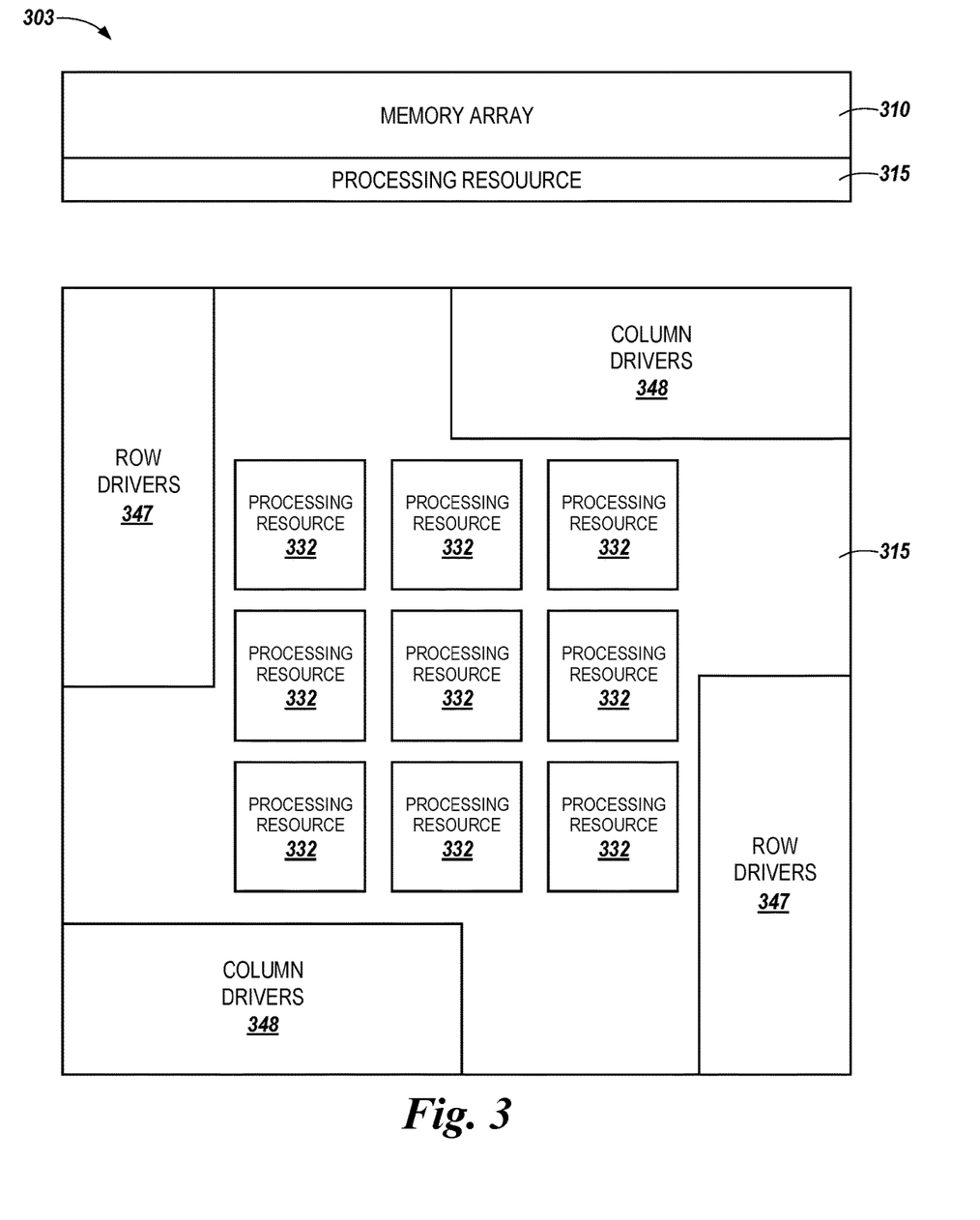
FIG. 3 is a block diagram of an example memory device including a plurality of layers in accordance with a number of embodiments of the present disclosure.

FIG. 3 is a block diagram of an example memory device 303 including a plurality of layers in accordance with a number of embodiments of the present disclosure. The memory device 303 can be analogous to memory device 103 previously described in connection with FIG. 1.

The memory device 303 is a three-dimensional (3D) memory device which includes multiple layers stacked together. As an example, a first layer 310 (e.g., memory array as illustrated in FIG. 3) of the memory device 303 is coupled to a second layer 315 (e.g., CMOS under array as illustrated in FIG. 3) of the memory device 303. Although the first layer 310 is shown as being on the second layer 315, the first layer 310 and the second layer 315 can be designed to comprise a number of different orientations such that the first layer 310 is coupled to the second layer 315. The examples described herein are not limited to a specific orientation between the first layer 310 and the second layer 325. The first layer 310 of the memory device 303 can include an array of memory cells. Although embodiments are not so limited, memory cells of the array can include DRAM memory cells.

The second layer 315 can include a number of logic blocks that are configured to perform various functions, for example, using data values stored in the array of memory cells. The second layer 315 can be described as a processing resource 315. The processing resource 315 can be comprised of a plurality of processing resources 332. The second layer can also include row drivers 347 and/or column drivers 348. Although nine processing resources 332 are shown in FIG. 3, the processing resource 315 can include more or less processing resources 332 than those shown here.

The second layer 315 may be one of a plurality of logic blocks included within the memory device 303. The processing resources 332 can be configured to perform AI processing. For example, the processing resources 332 can be configure as a network (e.g., neural network). Each of the processing resources 332 can be a node in a neural network. Each of the processing resources can be coupled to different memory cells of the memory array 310 which can store weights of the network and inputs to the network. The processing resources 332 can be interconnected such that the outputs of some of the processing resources 332 can be received as input by other of the processing resources 332. A result of the AI processing performed by the processing resources 332 can be stored back to the memory array 310 and/or can be latched by sense amplifiers.

The second layer 315 can further include row drivers 347 and column drivers 348 that can be enabled to activate a row (or rows) and/or a column (or columns) of a memory array (e.g., memory array 310). As described herein, row drivers 347 and column drivers 348 can receive address signals decoded by respective row decoders and column decoders that are controllable by control circuitry such as control circuitry 105 of FIG. 1.

Figure 4:
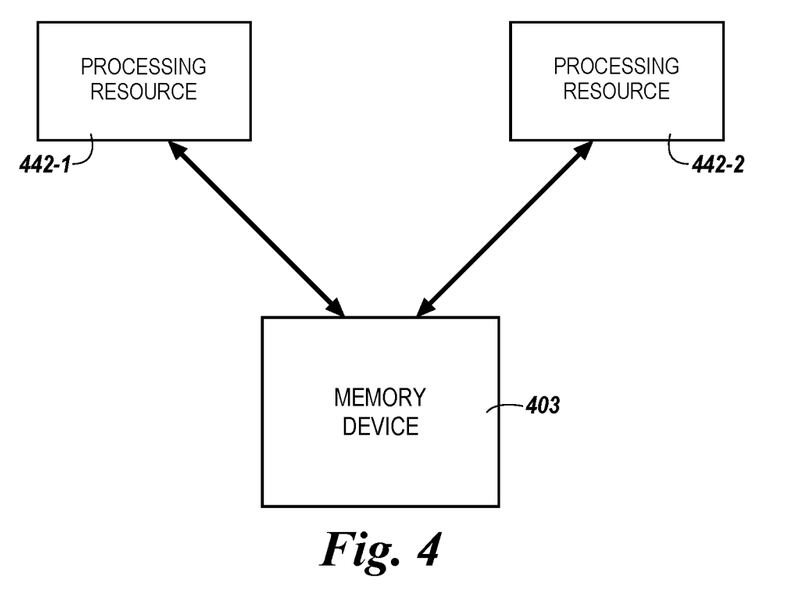
FIG. 4 is a block diagram of a memory device and a plurality of processing resources external to the memory device in accordance with a number of embodiments of the present disclosure.

FIG. 4 is a block diagram of a memory device 403 and a plurality of processing resources 442-1 and 442-2 external to the memory device 403 in accordance with a number of embodiments of the present disclosure. The memory device 403 is analogous to the memory device 103 in FIG. 1. The processing resources 442-1 and 442-2 can be analogous to the host 102 and the processing resource 222 in FIGS. 1 and 2, respectively.

In various examples, the processing resource 442-2 can perform AI processing and can store the result of the AI processing in the memory device 403. The processing resource 442-1 can provide access commands to the memory device 403. The memory device can retrieve the requested data and can format the data to a format that is compatible with the processing resource 442-1 and/or an application hosted by the processing resource 442-1. The memory device 403 can provide the formatted data to the processing resource 442-1.

The formatting of the data stored by the processing resource 442-2 can be an extension of the AI processing and may be considered AI processing. In some examples, the AI processing performed by the processing resource 442-2 may be incomplete and/or may be utilized to perform additional AI processing by the memory device 403. For instance, the processing resource 442-2 may identify features of an image and provide data defining the identified feature to the memory device 403. The memory device 403 may receive the data identifying the features of the image and may also receive the actual image. The memory device 403 may further perform AI processing to perform facial recognition on the features of the image utilizing the data describing the image and/or the image. The memory device 403 may store an identifier corresponding to the image and/or features of the image. The memory device 403 may also store data describing the confidence on the identification of the image and may store additional possible identifiers corresponding to the image.

The memory device 403 can provide data corresponding to the identifier of the image, confidence on the identification of the image, and/or possible identifiers corresponding to the image to processing resource 442-1 and/or the processing resource 442-2. In some examples, the processing resource 442-2 may continue to perform AI processing on the data describing the identification, the confidence of the identification, and/or possible identifications of the image. For example, the processing resource 442-2 may use the identification to scan further images to determine whether the additional images provide a match for the identification generated by the memory device 403. The memory device 403 and the processing resource 442-2 can function as a unit to perform multifaceted AI processing. The memory device 403 and/or the processing resource 442-2 may independently and/or collectively control the AI processing performed in the memory device 403 and the processing resource 442-2.

In various examples, the processing resource 442-1 can store data in the memory device which can be used to perform AI processing by the processing resource 442-2. However, the data may be in a format that is incompatible with the processing resource 442-2 and/or an application hosted by the processing resource 442-2. The memory device 403 may format the data in a format compatible with the processing resource 442-2 prior to storing the data and/or post storing the data in a memory array of the memory device 403.

The memory device 403 can extend the functionality of the processing resource 442-2 by extending the interface of the processing resource 442-2. For example, the processing resource 442-1 and/or an application hosted by the processing resource 442-1 may be simplified to utilize a single interface for the processing resource 442-2 and/or additional processing resources that perform AI processing regardless of whether the single interface is compatible with the processing resource 442-2 and/or the processing resources. The memory device 403 may receive data in a format utilized by the processing resource 442-1 and may re-format the data to a format compatible with the processing resource 442-2 and/or additional processing resources.

Figure 5:
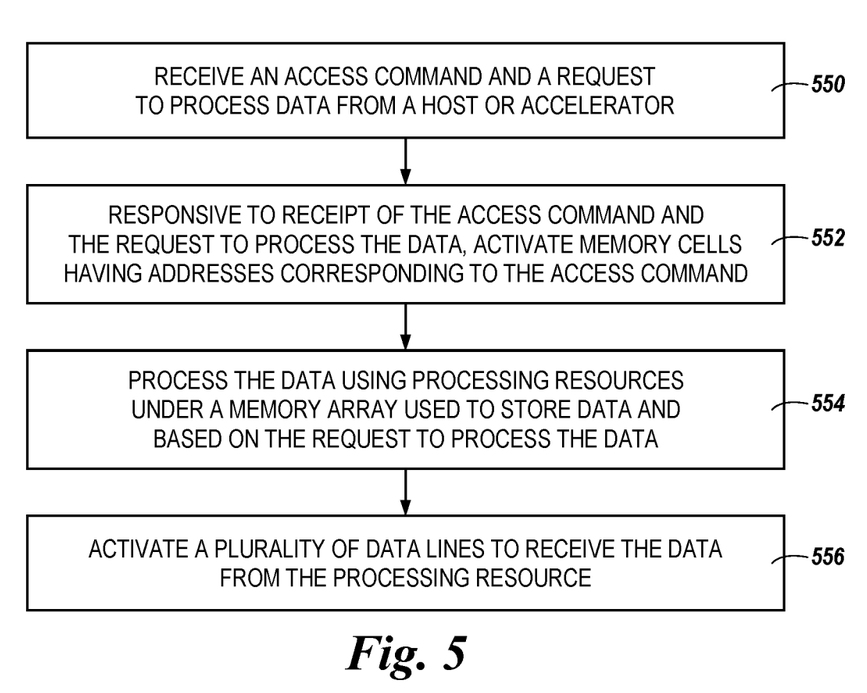
FIG. 5 illustrates an example flow diagram of a method for supplementing AI processing in memory in accordance with a number of embodiments of the present disclosure.

FIG. 5 illustrates an example flow diagram of a method for supplementing AI processing in memory in accordance with a number of embodiments of the present disclosure. At 550, an access command and a request to process data can be received from a host device or accelerator. The access command and/or the request can be provided separately and/or at a same time. For example, the request can be a separate command from the access command or the request can be provided in a same command as the access command.

At 552, responsive to receipt of the access command and the request to process the data, memory cells can be activated where the memory cells have addresses corresponding to the access command. The memory cells can comprise data that can be used for AI processing. For instance, the data can comprise an image, natural language, and/or IP addresses, among other possible data sets that can be used for training or for classification.

At 554, the data can be processed using processing resources under a memory array. The memory array can be used to store data. The data can be processed based on the request to process the data. Control circuitry of the memory device can activate the processing resources and the memory cells based on receipt of the request.

At 556, a plurality of data lines can be activated to receive the data from the processing resource. The processing resources hosted by the memory device and used for AI processing can be coupled to sense amplifiers. Given that each of the processing resources can be coupled to multiple memory cells which in turn are coupled to different sense lines of the memory array, each of the processing resources can be coupled to a portion of the sense amplifiers of the memory array or each of the processing resources can be coupled to a plurality of the sense amplifiers.

The control circuitry can activate the sensing circuitry to latch the data generated by processing resources. The control circuitry can also store the data generated by the processing resources back to the memory cells and can activate the sense amplifiers to latch the processed data stored in the memory cells. The control circuitry can activate the data lines to transfer the data stored in the sense amplifiers to the data lines.

The request to process data stored in the memory array can include identifiers of a plurality of operations to prepare the data for a machine learning operation which is to be performed by the host device or accelerator. The operations can also be utilized for machine learning and not just for preparing data for machine learning. As used herein, operations for AI processing can include standard operations such as AND and OR operations and may include operations utilized for neural networks. For example, loading weights for a network may be considered operations. Operations used to configure a network can be AI processing. For example, configuring a network to include selecting a quantity of nodes and/or changing the topology of a network can be considered operations.

The request to process data can include identifiers of a plurality of operations to perform the machine learning operations by a processing resource instead of a host and/or accelerator. The operations can be AI processing if the host and/or accelerator (e.g., AI chip) would have performed the operations or equivalent operations to perform AI processing. Offloading the operations from the AI chip to the processing resources of the memory device can include performing the operation in the memory device that would otherwise be performed in the AI chip. In some examples, the host and/or accelerator has the capability to perform the operations offloaded to the memory device but elects to offload the operations to allow for a greater throughput and/or efficiency in performing the operations.

In various examples, a memory device configured to perform AI processing can include a memory array, data lines, and control circuitry coupled to the memory array. The control circuitry can be configured to receive an access command and responsive to receipt of the access command, retrieve data from the memory array. The control circuitry can also be configured to perform a plurality of operations on the data. The control circuitry can perform the operations via processing resources hosted by the memory device. The processing resources may be any of the processing resources hosted by the memory device and described herein. The control circuitry can update the data lines with a result of the plurality of operations by moving the data from the processing resources to the data lines.

The operations can be performed on the data to convert the data from a first format to a second format. Converting the data can include, for example, decompressing the data in a YCC format to yield the data in an RGB format.

In some examples, the request can identify the operations to be performed as requested by the host and/or accelerator. The request can also identify a format that the data should be provided in without identifying specific operations that are to be performed. Identifying the operations that are to be performed by the memory device can, in some examples, include identifying an order in which the operations are to be performed. The plurality of operations can include a pre-processing of the data prior to providing the data to the host and/or accelerator.

The data lines can be coupled to a plurality of latches. The latches can be used to latch charges provided in the data lines. The control circuitry can update the data lines by updating the latches coupled to the data lines. Updating the data lines can include moving charges representing the data to the data lines.

The processing resources of the memory device can perform operation on streams of the data stored in the memory array. For instance, the size of the data on which the operations are performed can be equal to a width of a bus (e.g., data bus) used to provide the data to the host and/or accelerator. The size of the data on which the operations are performed may include an interval of the width of a bus (e.g., data bus). The size of the data on which the operations are performed may be a plurality of widths of a bus. The data may be partitioned and provided to the host and/or accelerator in multiple partitions being a width of a bus.

In various examples, an access command can be received by the memory device. The memory device can also receive network setting from a host and/or accelerator for processing data identified by the access command. The memory device can configure a plurality of processing resources into a network utilizing the network setting and memory cells of the memory array storing the data. The memory device can process the data identified by the access command utilizing the configured network. The network can include an artificial neural network or a different type of network which can be utilized for AI processing.

The network setting can include weights of the neural network, a quantity of nodes of the neural network. The network settings can include a network type such as a neural network. The network settings can also include operations used by the nodes to combine the inputs received by the nodes and the weights corresponding to each of the nodes. The network settings can also include a topology of the network which describes the activated communication paths between the processing resources.

Figure 6:
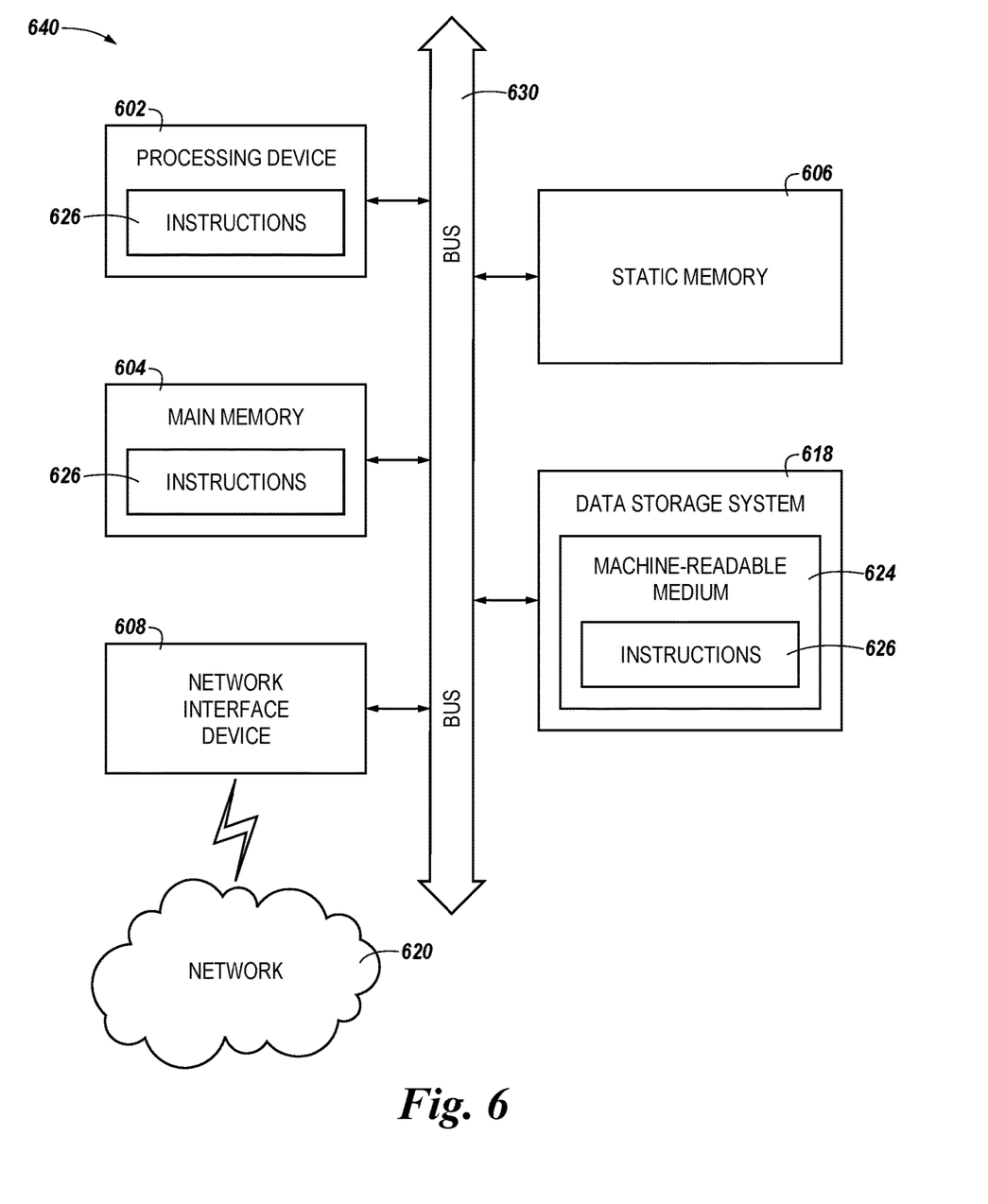
FIG. 6 illustrates an example machine of a computer system within which a set of instructions, for causing the machine to perform various methodologies discussed herein, can be executed.

FIG. 6 illustrates an example machine of a computer system 640 within which a set of instructions, for causing the machine to perform various methodologies discussed herein, can be executed. In various embodiments, the computer system 640 can correspond to a system (e.g., the system 100 of FIG. 1) that includes, is coupled to, or utilizes a memory sub-system (e.g., the memory device 103 of FIG. 1) or can be used to perform the operations of a controller (e.g., the control circuitry 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 640 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 640 can further include a network interface device 608 to communicate over the network 620.

The data storage system 618 can include a machine-readable storage medium 624 (also known as a computerreadable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 640, the main memory 604 and the processing device 602 also constituting machine-readable storage media.

In one embodiment, the instructions 626 include instructions to implement functionality corresponding to the host 102 and/or the memory device 103 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a memory device comprising:
        a memory array;
        a processing resource; and
        control circuitry coupled to the memory array and to the processing resource, configured to:
            responsive to receipt of a first command from a host, cause the processing resource to be activated;
            cause raw data to be transferred from the memory array to the processing resource via input output (I/O) lines in response to an access command, provided by the host, without a request to preprocess data;
            cause instructions, received from the host, to be executed to process the raw data responsive to receipt of a second command from the host; and
            responsive to executing the instructions, cause processed data to be transferred from the processing resource to the memory array via the I/O lines.

2. The apparatus of claim 1, wherein the control circuitry is further configured to receive the access command and the second command from one or more processing resources of the host.

3. The apparatus of claim 1, wherein the instructions are executable by the host and the processing resource.

4. The apparatus of claim 1, wherein the control circuitry is further configured to receive the second command describing a type of artificial intelligence processing to be performed by the processing resource.

5. The apparatus of claim 1, wherein the access command received from the host instructs a loading of the raw data from the memory array to a register within the apparatus.

6. The apparatus of claim 1, wherein the control circuitry is further configured, responsive to receipt of the second command, to configure a network implemented by the processing resource.

7. The apparatus of claim 1, wherein the control circuitry is further configured, responsive to receipt of the second command, to configure the processing resource to perform machine learning operations.

8. An apparatus, comprising:
    a memory device comprising:
        a memory array;
        a processing resource; and
        control circuitry coupled to the memory array and to the processing resource, configured to:
            responsive to receipt of a first command from a host, cause the processing resource to be activated;
            cause raw data to be transferred from the memory array to the processing resource via input output (I/O) lines in response to an access command, provided by the host, without a request to preprocess data;
            cause machine learning operations, received from the host, to be executed to process the raw data responsive to receipt of a second command from the host; and
            responsive to executing the machine learning operations, cause process processed data to be transferred from the processing resource to the memory array via the I/O lines.

9. The apparatus of claim 8, wherein the control circuitry is further configured to receive identifiers of the machine learning operations to prepare the raw data for machine learning performed by the host.

10. The apparatus of claim 9, wherein the control circuitry is further configured to receive the identifiers of the machine learning operations to perform the machine learning operations at the processing resource instead of using resources of the host.

11. The apparatus of claim 8, further comprising different processing resources under the memory array and coupled thereto;
    wherein the control circuitry is further configured to write the processed data to memory cells of the memory array that are coupled to the different processing resources.

12. A method comprising:
    responsive to receipt of a first command from a host, activating a processing resource of a memory device;

transferring raw data, via input output (I/O) lines, from a memory array of the memory device to the processing resource of the memory device in response to an access command provided by the host,
  wherein the raw data was created by the host responsive to performing machine learning operations;
executing different machine learning operations, received from the host, to process the raw data responsive to receipt of a second command from the host; and
responsive to executing the different machine learning operations, transferring processed data from the processing resource to the memory array via the I/O lines.

13. The method of claim 12, further comprising providing the processed data to the host for further processing using a different number of machine learning operations.

14. The method of claim 12, further comprising providing the processed data to a different processing resource for further processing using a different number of machine learning operations.

15. The method of claim 14, wherein the different processing resource is coupled to the memory device via an interface.

16. The method of claim 12, further comprising receiving, at the memory device, weights for executing the different machine learning operations.

17. The method of claim 16, wherein the weights are for implementing an artificial neural network using the processing resource and the machine learning operations.

18. The method of claim 12, further comprising executing the different machine learning operations to train weights for an artificial neural network wherein the processed data comprises the weights.

19. The method of claim 18, further comprising configuring a different processing resource implemented under the memory array using the weights.

20. The method of claim 18, further comprising configuring a different processing resource coupled to the memory device using the weights, wherein the different processing resource implements the artificial neural network.

* * * * *